(12) United States Patent
Hsieh

(10) Patent No.: US 11,705,918 B2
(45) Date of Patent: Jul. 18, 2023

(54) INCREMENTAL ANALOG-TO-DIGITAL CONVERTER AND CIRCUIT SYSTEM USING THE SAME

(71) Applicant: NUVOTON TECHNOLOGY CORPORATION, Hsinchu (TW)

(72) Inventor: Chung Ming Hsieh, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/680,819

(22) Filed: Feb. 25, 2022

(65) Prior Publication Data

US 2023/0021989 A1 Jan. 26, 2023

(30) Foreign Application Priority Data

Jul. 26, 2021 (TW) ................................ 110127310

(51) Int. Cl.
*H03M 1/30* (2006.01)
*H03M 3/00* (2006.01)

(52) U.S. Cl.
CPC ............... *H03M 1/30* (2013.01); *H03M 3/39* (2013.01)

(58) Field of Classification Search
CPC .................................. H03M 1/00; H03M 1/30
See application file for complete search history.

(56) References Cited

U.S. PATENT DOCUMENTS

| | | | | |
|---|---|---|---|---|
| 6,163,204 A | * | 12/2000 | Mantov ................ | G01R 19/155 327/143 |
| 7,644,261 B2 | * | 1/2010 | Hsieh ..................... | G06F 1/24 713/1 |
| 7,772,795 B2 | * | 8/2010 | Hsieh ..................... | G05B 19/19 318/560 |
| 9,386,240 B1 | * | 7/2016 | Johansson ............. | H04N 25/771 |
| 9,467,163 B1 | * | 10/2016 | Imaizumi ............... | H03M 3/32 |
| 9,893,737 B1 | * | 2/2018 | Keramat ................ | H03K 5/08 |
| 9,998,112 B1 | * | 6/2018 | Chang ................... | G06F 1/24 |
| 10,868,563 B2 | * | 12/2020 | Onishi .................. | H03M 3/422 |
| 11,218,158 B1 | * | 1/2022 | Patil ..................... | H03M 1/1071 |
| 2006/0038708 A1 | * | 2/2006 | Luh ...................... | H03M 3/408 341/143 |
| 2009/0091517 A1 | * | 4/2009 | Park ..................... | G09G 3/2927 345/204 |
| 2010/0007295 A1 | * | 1/2010 | Yang ................... | H02P 29/0241 318/400.22 |

(Continued)

*Primary Examiner* — Lam T Mai
(74) *Attorney, Agent, or Firm* — Muncy, Geissler, Olds & Lowe, P.C.

(57) ABSTRACT

An incremental analog-to-digital converter including a first-stage non-delay memorization element and other elements is disclosed. An ending time point of a second reset signal received by the first-stage non-delay memorization element is later than an ending time point of a first reset signal received by the other elements by at least one clock cycle, a reset duration of the first-stage non-delay memorization element is longer than a reset duration of the other element, so that the first-stage non-delay memorization element can be prevented from occurring overshoot or spike on an output thereof, and the incremental analog-to-digital converter can maintain a good signal-to-noise and distortion ratio under the condition that the internal elements has low swing limits.

17 Claims, 5 Drawing Sheets

(56) References Cited

U.S. PATENT DOCUMENTS

| | | | |
|---|---|---|---|
| 2010/0123709 A1* | 5/2010 | Huh | G09G 3/2922 |
| | | | 345/60 |
| 2013/0135134 A1* | 5/2013 | Lin | H03M 1/1215 |
| | | | 341/172 |
| 2015/0280734 A1* | 10/2015 | Si | H03M 3/478 |
| | | | 341/143 |
| 2016/0285471 A1* | 9/2016 | Imaizumi | H03M 3/32 |
| 2017/0229177 A1* | 8/2017 | Wang | G11C 13/0069 |
| 2020/0035145 A1* | 1/2020 | Tseng | G09G 3/2014 |
| 2020/0259415 A1* | 8/2020 | Chiu | H02M 3/1584 |
| 2020/0343905 A1* | 10/2020 | Shu | H03M 3/424 |
| 2021/0241672 A1* | 8/2021 | Gao | G09G 3/2003 |
| 2021/0242878 A1* | 8/2021 | Modaffari | H03M 3/37 |

* cited by examiner

INCREMENTAL ANALOG-TO-DIGITAL CONVERTER AND CIRCUIT SYSTEM USING THE SAME

BACKGROUND OF THE INVENTION

1. Field of the Invention

The present invention relates to an incremental analog-to-digital converter, and more particularly to an incremental analog-to-digital converter in which a first-stage integrator has reduced overshoot or spike when being reset, and a circuit system using the above-mentioned incremental analog-to-digital converter; for example, the circuit system can be used for sensing or monitoring environment.

2. Description of the Related Art

An incremental analog-to-digital converter (abbreviated as I-ADC) is a branch of the sigma-delta ADC (abbreviated as SD-ADC), and mainly used in the field of low frequency and high precision. Due to the over-sampling characteristics, circuit elements of the I-ADC do not need to have enhanced matching and linearity, compared with the other ADC having the same Nyquist rate at the same resolution.

Although the structure of the I-ADC is similar to that of SD-ADC, the conversion of I-ADC may be a one-to-one relationship, it does not depend on the previous result of SD-ADC, and this feature is more like a Nyquist-rate ADC. The I-ADC has at least one integrator in the feedback loop thereof, the integrator and the digital filter after the integrator are memorization elements, so the integration value should be cleared before each start of conversion; that is, every time an analog signal is converted to a digital signal, a reset operation is required to clear the values of the integrator and the digital filter before the start of conversion for the next analog signal.

Please refer to FIG. 1, the conventional I-ADC 1 includes a first-stage integrator module 11, a weighted adder module 12 and 14, a second-stage integrator module 13, a limiter 15, a quantizer 16, a feedback module 17 and a weighted subtractor module 18. The weighted subtractor module 18 performs weighted subtraction on an input analog signal $V_A$ and a feedback signal $V_F$ generated by the feedback module 17, to generate and input a signal V0 to the first-stage integrator module 11. The first-stage integrator module 11 integrates the signal V0 to generate a signal V1. The weighted adder module 12 performs weighted addition on the signal V1 and the input analog signal $V_A$, to generate and input a signal V2 to the second-stage integrator module 13. The second-stage integrator module 13 integrates the signal V2 to generate a signal V3. The weighted adder module 14 performs weighted addition on the signals V1 and V3, and the input analog signal $V_A$, to generate and input a signal V4 to the limiter 15. The limiter 15 limits an amplitude of the signal V4 to generate a signal V5. The quantizer 16 quantifies the signal V5 to generate an output digital signal $V_D$. The feedback module 17 receives and delays the output digital signal $V_D$ to generate a feedback signal $V_F$. The feedback signal $V_F$ is a delay signal generated based on the output digital signal $V_D$.

Please refer to FIGS. 1 and 2. The I-ADC 1 takes multiple clock cycles to perform the analog-to-digital conversion of the input analog signal $V_A$ to output the final output digital signal $V_D$, and after the analog-to-digital conversion of the input analog signal $V_A$ is completed and before the analog-to-digital conversion of the next input analog signal $V_A$ starts, it takes multiple clock cycles to reset the memorization elements in the I-ADC 1 to clear the values of the memorization elements.

Please refer to FIGS. 1 and 3. A first reset signal RST is directly received by the first-stage integrator module 11, the second-stage integrator module 13 and the feedback module 17, and is used to reset the first-stage integrator module 11, the second-stage integrator module 13 and the feedback module 17. The first-stage integrator module 11, the second-stage integrator module 13 are non-delay elements and the feedback module 17 is a delay element, so in the first clock cycle of the resetting operation, the signal generated by the first-stage integrator module 11 V1 includes the result of integrating the input analog signal $V_A$ only and does not include the result of integrating the feedback signal $V_F$ (at this time, the feedback signal $V_F$ is reset to 0), and it causes that the signal V1 has overshoot or spike 31.

The I-ADC 1 can generally recover from overshoot after a few consecutive clock cycles and it does not affect the final performance of the I-ADC 1; however, if the internal circuits of the I-ADC 1 have voltage swing limits, a signal-to-noise and distortion ratio (SNDR) of the I-ADC 1 decreases correspondingly; especially, in the case that the I-ADC 1 has significant voltage swing limits, the effect is very obvious. The I-ADC 1 shown in FIG. 1 is taken as an example for description, in the condition that there is no swing limit, the SNDR of the I-ADC 1 can reach 95.5 dB, but when the I-ADC 1 has the swing limit in a range of 0.8 volts to −0.8 volts, the SNDR of the I-ADC 1 is reduced to 83 dB. According to the fast Fourier transform (FFT) of the output digital signal VD, it can be seen that the harmonic distortion is very obvious.

SUMMARY OF THE INVENTION

An objective of the present invention is to provide an incremental analog-to-digital converter (I-ADC) including a conversion circuit and a reset signal processing module. The conversion circuit is configured to perform incremental analog-to-digital conversion, and includes a plurality of integrator modules and a feedback module. The reset signal processing module is configured to receive a first reset signal, and generate a second reset signal based on the first reset signal, wherein starting time points of the first reset signal and the second reset signal are the same, an ending time point of the second reset signal is later than an ending time point of the first reset signal by at least one clock cycle. A first-stage integrator module of the plurality of integrator modules is reset by the second reset signal, and the other of the plurality of integrator modules and the feedback module are reset by the first reset signal.

An objective of the present invention is to provide an incremental analog-to-digital converter (I-ADC) including a conversion circuit and a reset signal processing module. The conversion circuit is configured to perform incremental analog-to-digital conversion, and includes a plurality of memorization elements, wherein the memorization elements include a first-stage non-delay memorization element. The reset signal processing module is configured to receive a first reset signal, and generate a second reset signal based on the first reset signal, wherein starting time points of the first reset signal and the second reset signal are the same, and an ending time point of the second reset signal is later than an ending time point of the first reset signal by at least one clock cycle. The first-stage non-delay memorization element is reset by the second reset signal, and the other of the plurality of memorization elements is reset by the first reset signal.

An objective of the present invention is to provide a circuit system including a signal acquisition device, the above-mentioned I-ADC and a processing device; the I-ADC is electrically connected to the signal acquisition device and the processing device.

According to the above-mentioned contents, the incremental analog-to-digital converter of the present invention can be prevented from occurring overshoot or spike on the first-stage integrator module, which is a first-stage non-delay memorization element, after reset. Therefore, the incremental analog-to-digital converter of the present invention can maintain good SNDR under the condition of having swing limits.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
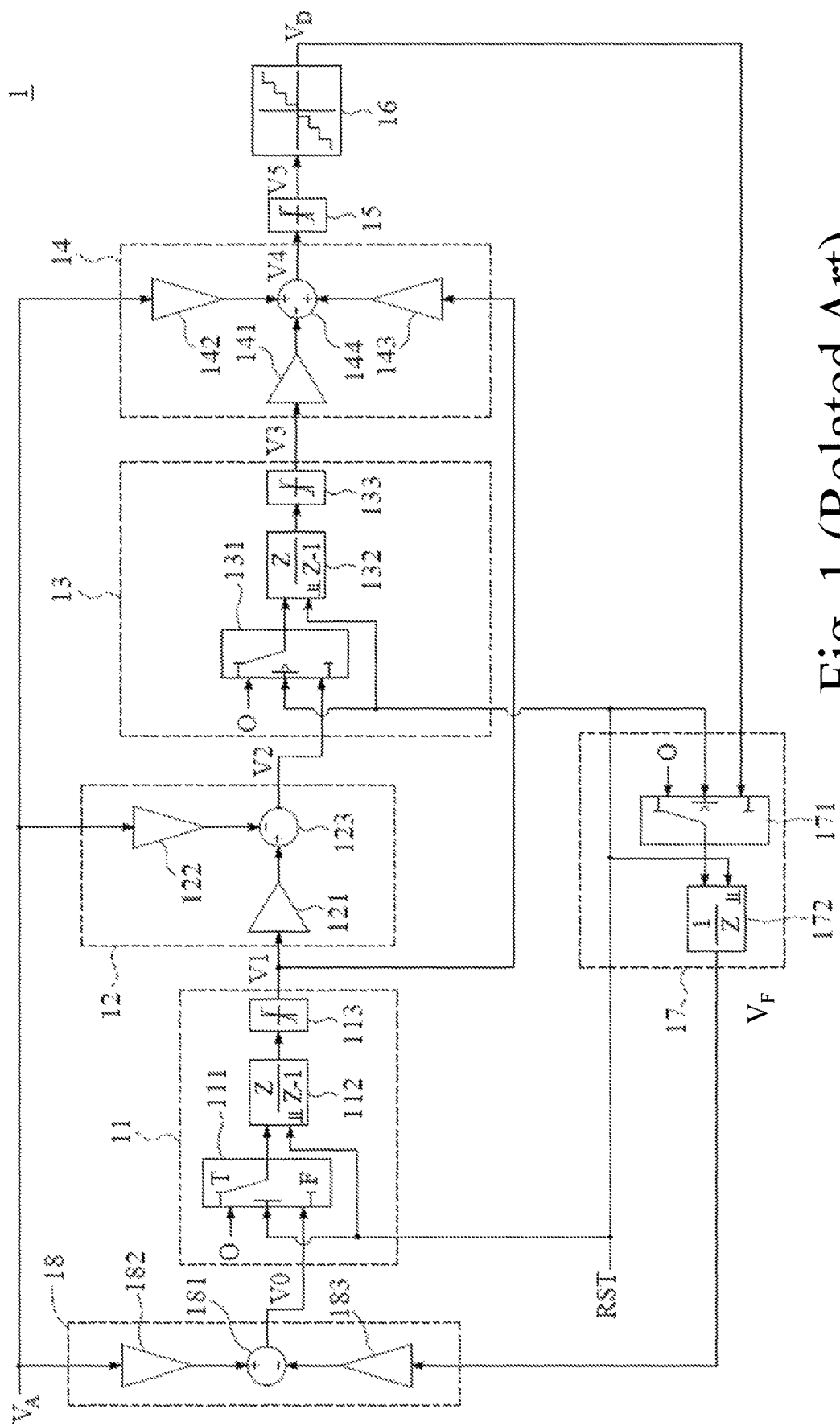
FIG. 1 is a schematic functional block view of a conventional I-ADC.
Figure 2:
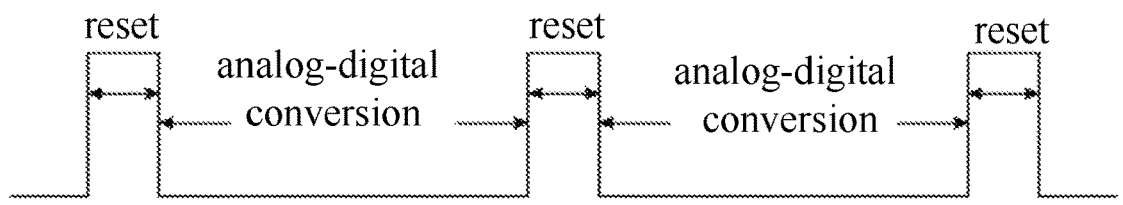
FIG. 2 is a schematic view of an operational state of conventional I-ADC.
Figure 3:
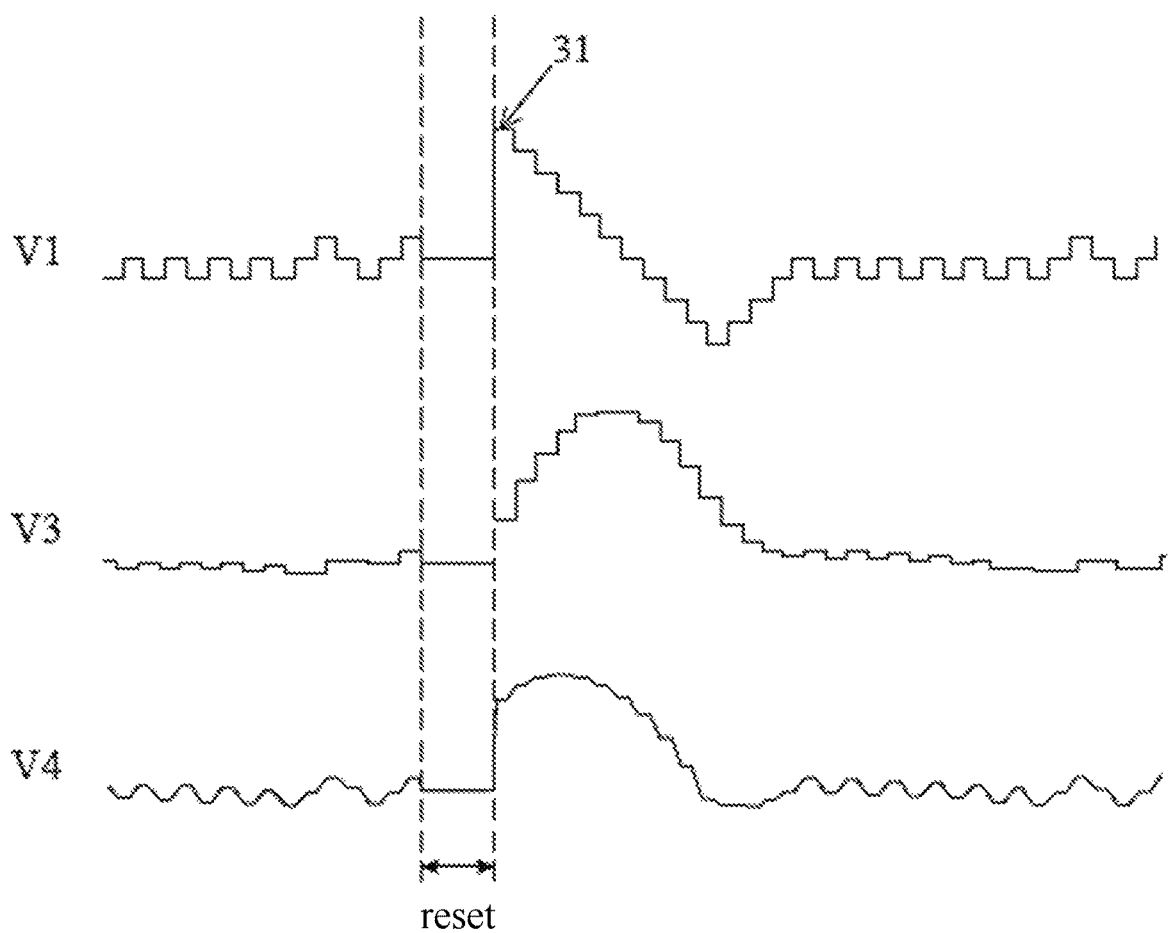
FIG. 3 is a schematic view of a signal waveform of the conventional I-ADC.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The present invention provides an embodiment of an incremental analog-to-digital converter, an ending time point of a second reset signal received by a first-stage non-delay memorization element is later than an ending time point of a first reset signal received by other elements by a at least one clock cycle, so as to prevent the output of the first-stage non-delay memorization element from occurring overshoot or spike; therefore, the incremental analog-to-digital converter of the present invention can maintain good SNDR under the condition that the internal elements of the incremental analog-to-digital converter have low swing limits. For example, the ending time point of the above-mentioned reset signal can be the time point when the reset signal is changed to logical false from the logical true, but the present invention is not limited thereto.

Particularly, compared with the conventional technology, the incremental analog-to-digital converter of the present invention includes a reset signal processing module additionally, the reset signal processing module is configured to process the first reset signal to generate the second reset signal, the first reset signal has a starting time point the same as that of the second reset signal, and the ending time point of the second reset signal is later than the ending time point of the first reset signal by at least one clock cycle. For example, the starting time point of the above-mentioned reset signal can be the time point when the reset signal is changed to logical true from logical false.

Simply speaking, the incremental analog-to-digital converter may include a conversion circuit and a reset signal processing module, the conversion circuit implements an incremental analog-to-digital conversion, and a first-stage non-delay memorization element of the conversion circuit is reset by the second reset signal; the other memorization element of the conversion circuit, which needs to be reset, is reset by the second reset signal. The conversion circuit for implementing the incremental analog-to-digital conversion can be an incremental analog-to-digital converter including more than two stages of the integrator modules and the feedback modules.

Figure 4:
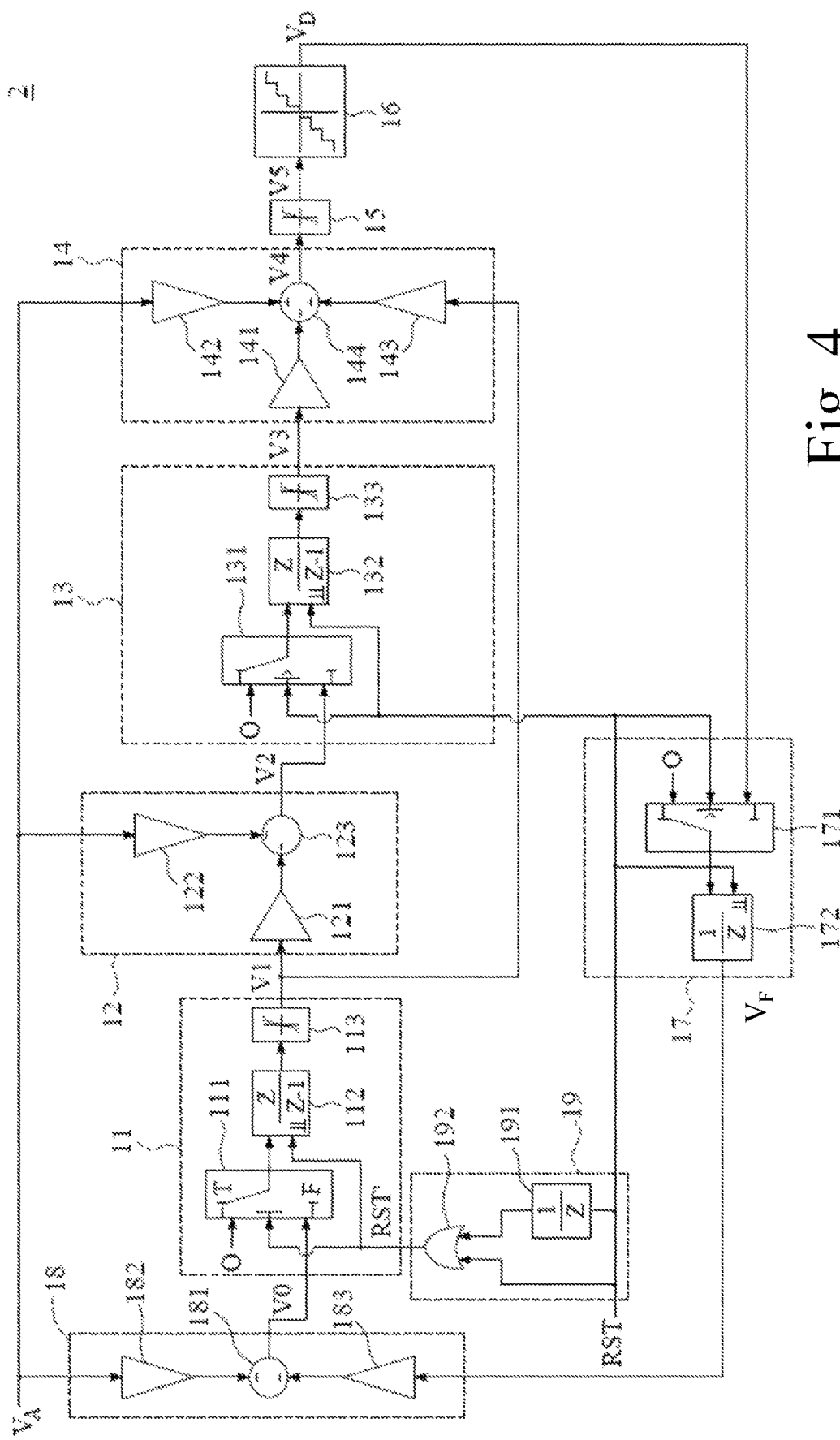
FIG. 4 is a schematic functional block view of an embodiment of a I-ADC of the present invention.

Please refer to FIG. 4. The incremental analog-to-digital converter 2 of the present invention includes a first-stage integrator module 11, weighted adder modules 12 and 14, a second-stage integrator module 13, a limiter 15, a quantizer 16, a feedback module 17, a weighted subtractor module 18 and a reset signal processing module 19. Except for the reset signal processing module 19, the multiple hardware elements of the conversion circuit can be grouped into non-delay elements and the delay elements; some non-delay elements having memorization characters need to be reset after each analog-to-digital conversion. The memorization non-delay element includes the first-stage integrator module 11, the second-stage integrator module 13 and the feedback module 17; the first-stage integrator module 11 is a first-stage non-delay memorization element.

The first-stage integrator module 11 is electrically connected to the weighted subtractor module 18, the reset signal processing module 19 and the weighted adder module 12. The second-stage integrator module 13 is electrically connected to the weighted adder modules 12 and 14. The weighted adder module 14 is electrically connected to the first-stage integrator module 11 and the limiter 15. The quantizer 16 is electrically connected to the limiter 15 and the feedback module 17, and the feedback module 17 is electrically connected to the weighted subtractor module 18.

The weighted subtractor module 18 performs weighted subtraction on an input analog signal $V_A$ and a feedback signal $V_F$ generated by the feedback module 17, to generate and input the signal V0 to the first-stage integrator module 11. Furthermore, the weighted subtractor module 18 is formed by the two amplifiers 182 and 183, and the subtractor 181. The subtractor 181 is electrically connected to the amplifiers 182 and 183, and the first-stage integrator module 11. The amplifiers 182 and 183 are configured to amplify the input analog signal $V_A$ and the feedback signal $V_F$, respectively, and the subtractor 181 subtracts the amplified feedback signal $V_F$ from the amplified input analog signal $V_A$, to generate the signal V0; that is, $V0[n]=a1*V_A[n]-a2*VF[n]$, wherein a1 and a2 are gains of the amplifiers 182 and 183, respectively; n is a discrete time point, for example, "n=x" indicates that the current time point is the x-th clock cycle. Furthermore, $V_F$ is a signal delayed from the output digital signal $V_D$, for example, $V_F[n]=V_D[n-1]$.

The first-stage integrator module 11 integrates the signal V0 to generate a signal V1. Furthermore, the first-stage integrator module 11 can include a switch 111, a transfer function unit 112 and a limiter 113. The switch 111 is electrically connected to the reset signal processing module 19 and the weighted subtractor module 18, the transfer function unit 112 is electrically connected to the switch 111 and the limiter 113, and the limiter 113 is electrically connected to the weighted adder module 12. The switch 111 receives the signal V0, the signal of 0 and the second reset signal RST', and selectively outputs the signal V0 or the signal of 0 to the transfer function unit 112 based on whether the second reset signal RST' is logical true or logical false. When the second reset signal RST' is logical true, the switch 111 outputs the signal of 0; otherwise, the switch 111 outputs the signal V0. The transfer function of the transfer function unit 112 is z/(z−1) to integrate the output the signal V0. The transfer function unit 112 also receives the second reset signal RST', and is reset when the second reset signal RST' is logical true. The limiter 113 limits the output of the transfer function unit 112, to generate the signal V1. Furthermore, the transfer function of the transfer function unit 112 is z/(z−1), so the first-stage integrator module 11 is a memorization non-delay element of the I-ADC 2, and is a first-stage non-delay memorization element among at least one non-delay element.

The weighted adder module 12 performs weighted addition on the signal V1 and the input analog signal $V_A$, to generate and input a signal V2 to the second-stage integrator module 13. Furthermore, the weighted adder module 12 is formed by the two amplifiers 121 and 122, and the adder 123. The adder 123 is electrically connected to the amplifiers 121 and 122, and the second-stage integrator module 13. The amplifiers 121 and 122 are configured to amplify the signal V1 and the input analog signal $V_A$, respectively, and the adder 123 adds the amplified signal V1 and the amplified input analog signal $V_A$ to generate the signal V2, that is, $V2[n]=a3*V1[n]-a4*V_A[n]$, wherein a3 and a4 are gains of the amplifiers 121 and 122, respectively.

The second-stage integrator module 13 integrates the signal V2 to generate a signal V3. Furthermore, the second-stage integrator module 13 includes a switch 131, a transfer function unit 132 and a limiter 113. The switch 131 is electrically connected to the weighted adder module 12, the transfer function unit 132 is electrically connected to the switch 131 and the limiter 133, and the limiter 133 is electrically connected to the weighted adder module 14. The switch 131 receives the signal V2, a signal of 0, and the first reset signal RST, and selectively outputs the signal V2 or the signal of 0 to the transfer function unit 132 based on whether the first reset signal RST is logical true or logical false. For example, when the first reset signal RST is logical true, the switch 131 outputs the signal of 0; otherwise, the switch 131 outputs the signal V2. The transfer function of the transfer function unit 132 is z/(z−1) for integrating the signal V2. The transfer function unit 132 also receives the first reset signal RST, and is reset when the first reset signal RST is logical true. The limiter 133 limits the output of the transfer function unit 132 to generate the signal V3. The transfer function of the transfer function unit 112 is z/(z−1), so the second-stage integrator module 13 is a non-delay element of the I-ADC 2, and is a second-stage non-delay element among the at least one non-delay element. It should be noted that the transfer function of the transfer function unit 112 can be changed to 1/(z−1) from z/(z−1), to make the second-stage integrator module 13 become a delay element of the I-ADC 2.

The weighted adder module 14 performs weighted addition on the signals V1 and V3, and the input analog signal $V_A$, to generate and input a signal V4 to the limiter 15. The weighted adder module 14 is formed by three amplifiers 141~143 and the adder 144. The adder 144 is electrically connected to the amplifiers 141~143 and the limiter 15. The amplifiers 141~143 are configured to amplify the signal V3, the input analog signal $V_A$ and the signal V1, respectively, and the adder 144 is configured to add the amplified signals V1 and V3 and the input analog signal $V_A$ to generate a signal V4, that is, $V4[n]=a5*V3[n]+a6*V_A[n]+a7*V1[n]$, wherein a5~a7 are gains of the amplifiers 141~143, respectively.

The limiter 15 is configured to limit the amplitude of the signal V4 to generate a signal V5. The quantizer 16 quantifies the signal V5 to generate the output digital signal $V_D$. In an embodiment, the quantizer 16 can be, for example, an at-least-3-bit quantizer, but the concept of the present invention is not limited thereto. The feedback module 17 receives the output digital signal $V_D$, and delays the output digital signal $V_D$ to generate the feedback signal $V_F$, that is, the feedback signal $V_F$ is a delay signal generated based on the output digital signal $V_D$. The feedback module 17 includes a switch 171 and a transfer function unit 172, the switch 171 is electrically connected to the quantizer 16, the transfer function unit 172 is electrically connected to the switch 171 and the weighted subtractor module 18. The switch 171 receives the output digital signal $V_D$, a signal of 0, and the first reset signal RST, and selectively outputs the output digital signal $V_D$ or the signal of 0 to the transfer function unit 172 based on whether the first reset signal RST is logical true or logical false; for example, when the first reset signal RST is logical true, the switch 171 outputs the signal of 0; otherwise, the switch 171 outputs the output digital signal $V_D$. The transfer function of the transfer function unit 172 is 1/z for delaying the output digital signal $V_D$ by a clock cycle (that is, $V_F[n]=V_D[n-1]$), so as to generate the feedback signal $V_F$. The transfer function unit 132 also receives the first reset signal RST, and is reset when the first reset signal RST is logical true.

The reset signal processing module 19 receives the first reset signal RST and generates the second reset signal RST', the starting time point (for example, the time point where the logical level is changed to logical true from the logical false) of the first reset signal RST and the second reset signal RST' are the same, but the ending time point of the second reset signal RST' is later than the ending time point of the first reset signal RST by at least one clock cycle. Furthermore, the reset signal processing module 19 includes a transfer function unit 191 and an OR gate 192, the transfer function unit 191 is electrically connected to the OR gate 192, and the OR gate 192 is electrically connected to the first-stage integrator module 11. In this embodiment, the transfer function of the transfer function unit 191 is (1/z), so that the first reset signal RST is delayed by a clock cycle and the delayed first reset signal is outputted to the OR gate 192. The OR gate 192 performs OR calculation on the first reset signal RST and the delayed first reset signal, to generate the second reset signal RST', so that the ending time point of the second reset signal RST' is later (more delayed) than the ending time point of the first reset signal RST by a clock cycle.

It should be noted that the above-mentioned embodiment is illustrated based on the I-ADC 2 having two stages of the integrator modules, but the present invention is not limited thereto. In other embodiments, the conversion circuit used in the I-ADC can include three or more stages of integrator modules, and according to the inventive concept of the present invention, the first-stage integrator module is reset by the second reset signal RST', and the second-stage integrator module to the last-stage integrator module, and the feedback module are reset by the first reset signal RST. Simply speaking, during the reset process, each of the reset durations of the second-stage integrator module to the final-stage integrator module and the feedback module is shorter than the reset duration of the first-stage integrator module by at least one clock cycle.

Figure 5:
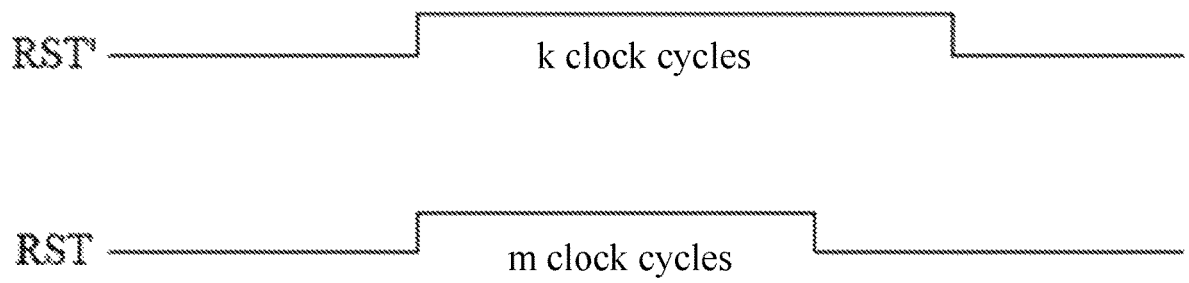
FIG. 5 is a schematic view of the signal waveform of a second reset signal received by a first-stage integrator module of a I-ADC and a first reset signal of the I-ADC, according to an embodiment of the present invention.
Figure 6:
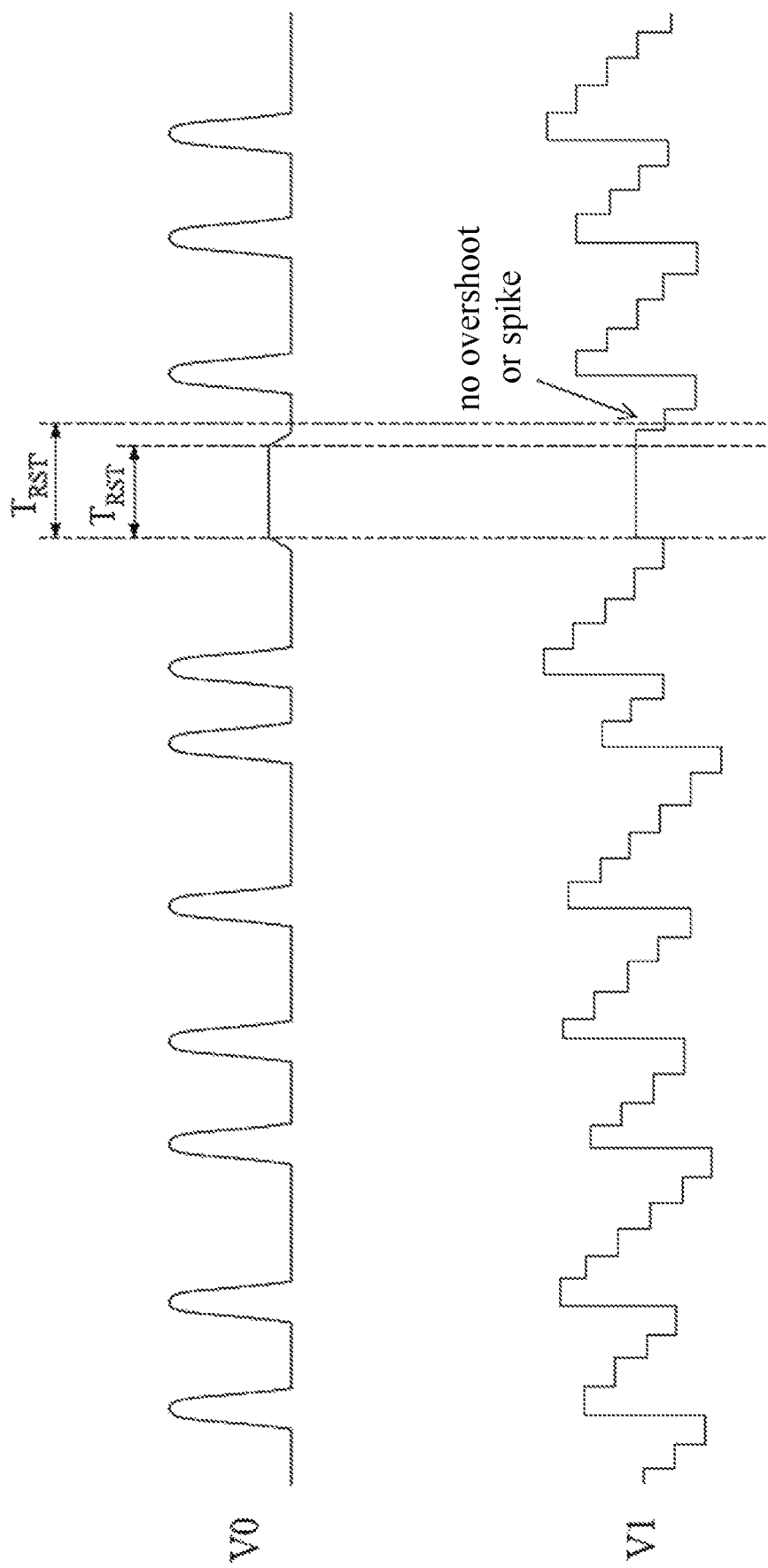
FIG. 6 is a schematic view of the signal waveform of an embodiment of a I-ADC of the present invention.

Please refer to FIGS. 4 and 5. As shown in FIG. 5, using the reset signal processing module 19 can make the period of the first reset signal RST as the m clock cycles and make the period of the second reset signal RST' as the k clock cycles, wherein k and m are integers, and k>m; in the embodiment shown in FIG. 4, k=m+1. Please refer to FIGS. 4 and 6, the working period TRST' of the second reset signal RST' is the k clock cycles, the working period TRST of the first reset signal RST is the m clock cycles, the first-stage integrator module 11 is reset by the second reset signal RST', so that the signal V1 generated by integrating the signal V0 after the first-stage integrator module 11 is reset does not have overshoot or spike. As a result, the I-ADC 2 can maintain good SNDR under the condition that the internal elements of the I-ADC 2 have voltage swing limits.

In addition, the embodiment of the present invention further provides a circuit system, the circuit system includes a signal acquisition device, an incremental analog-to-digital converter and a processing device. The incremental analog-to-digital converter is electrically connected to the signal acquisition device and the processing device. The signal acquisition device can be, for example, various types of sensors or measuring devices, but the present invention is not limited thereto. The signal acquisition device is configured to generate and input the input analog signal to the incremental analog-to-digital converter. The implementation of the incremental analog-to-digital converter is described in the above-mentioned contents, and the incremental analog-to-digital converter is configured to convert the input analog signal into the output digital signal. The processing device receives and processes the output digital signal, for example, the processing device can output, compute or analyze the output digital signal, but the concept of the present invention is not limited thereto.

According to the above-mentioned contents, the present invention provides an incremental analog-to-digital converter, a reset duration of a first-stage non-delay memorization element of the incremental analog-to-digital converter is longer than a reset duration of other memorization element of the incremental analog-to-digital converter, so as to prevent the first-stage non-delay memorization element from occurring overshoot or spike after being reset completely. As a result, the incremental analog-to-digital converter of the present invention can maintain good SNDR under the condition that the internal element has voltage swing limits.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An incremental analog-to-digital converter, comprising:
   a conversion circuit configured to perform incremental analog-to-digital conversion, and comprising a plurality of integrator modules and a feedback module; and
   a reset signal processing module configured to receive a first reset signal, and generate a second reset signal based on the first reset signal, wherein starting time points of the first reset signal and the second reset signal are the same, an ending time point of the second reset signal is later than an ending time point of the first reset signal by at least one clock cycle;
   wherein a first-stage integrator module of the plurality of integrator modules is reset by the second reset signal, and the other of the plurality of integrator modules and the feedback module are reset by the first reset signal.

2. The incremental analog-to-digital converter according to claim 1, wherein the plurality of integrator modules comprise the first-stage integrator module and a second-stage integrator module, and the other of the plurality of integrator modules comprises the second-stage integrator module.

3. The incremental analog-to-digital converter according to claim 2, further comprising a first weighted adder module, a second weighted adder module, a limiter, a quantizer and a weighted subtractor module, wherein the first-stage integrator module receives and integrates a first signal to generate a second signal, the first weighted adder module is electrically connected to the first-stage integrator module, and configured to perform weighted addition on the second signal and an input analog signal to generate a third signal, the second-stage integrator module is electrically connected to the first weighted adder module, and configured to receive and integrate the third signal to generate a fourth signal, the second weighted adder module is electrically connected to the second-stage integrator module and configured to perform weighted addition on the fourth signal, the second signal and the input analog signal to generate a fifth signal, the limiter is electrically connected to the second weighted adder module and configured to receive and limit the fifth signal to generate a sixth signal, the quantizer is electrically connected to the limiter and configured to quantify the sixth signal to generate an output digital signal, and the feedback module is electrically connected to the quantizer and configured to receive the output digital signal and generate a feedback signal by delaying the output digital signal, the weighted subtractor module is electrically connected to the feedback module and the first-stage integrator module and configured to perform weighted subtraction on the input analog signal and the feedback signal, so as to generate the first signal.

4. The incremental analog-to-digital converter according to claim 1, wherein the ending time point of the second reset signal is later than the ending time point of the first reset signal by a clock cycle.

5. The incremental analog-to-digital converter according to claim 4, wherein the reset signal processing module comprises an OR gate and a transfer function unit, the OR gate is electrically connected to the first-stage integrator module and the transfer function unit, the transfer function unit has a transfer function of $(1/z)$ and configured to delay the first reset signal by a clock cycle, and output the delayed first reset signal to the OR gate, wherein the OR gate is configured to perform OR calculation on the first reset signal and the delayed first reset signal to generate the second reset signal.

6. The incremental analog-to-digital converter according to claim 3, wherein a transfer function of a transfer function unit of the first-stage integrator module is $z/(z-1)$.

7. The incremental analog-to-digital converter according to claim 6, wherein a transfer function of a transfer function unit of the second integrator module is $z/(z-1)$.

8. The incremental analog-to-digital converter according to claim 6, wherein a transfer function of a transfer function unit of the second integrator module is $1/(z-1)$.

9. An incremental analog-to-digital converter, comprising:
a conversion circuit configured to perform incremental analog-to-digital conversion, and comprising a plurality of memorization elements, wherein the plurality of memorization elements comprise a first-stage non-delay memorization element; and
a reset signal processing module configured to receive a first reset signal, and generate a second reset signal based on the first reset signal, wherein starting time points of the first reset signal and the second reset signal are the same, and an ending time point of the second reset signal is later than an ending time point of the first reset signal by at least one clock cycle;
wherein the first-stage non-delay memorization element is reset by the second reset signal, and the other of the plurality of memorization elements is reset by the first reset signal.

10. A circuit system comprising:
a signal acquisition device;
an incremental analog-to-digital converter electrically connected to the signal acquisition device; and
a processing device electrically connected to the incremental analog-to-digital converter;
wherein the incremental analog-to-digital converter comprises:
a conversion circuit configured to perform incremental analog-to-digital conversion, and comprising a plurality of integrator modules and a feedback module; and
a reset signal processing module configured to receive a first reset signal, and generate a second reset signal based on the first reset signal, wherein starting time points of the first reset signal and the second reset signal are the same, an ending time point of the second reset signal is later than an ending time point of the first reset signal by at least one clock cycle;
wherein a first-stage integrator module of the plurality of integrator modules is reset by the second reset signal, and the other of the plurality of integrator modules and the feedback module are reset by the first reset signal.

11. The circuit system according to claim 10, wherein the plurality of integrator modules comprise the first-stage integrator module and a second-stage integrator module, and the other of the plurality of integrator modules comprises the second-stage integrator module.

12. The circuit system according to claim 11, wherein the incremental analog-to-digital converter further comprises a first weighted adder module, a second weighted adder module, a limiter, a quantizer and a weighted subtractor module, wherein the first-stage integrator module receives and integrates a first signal to generate a second signal, the first weighted adder module is electrically connected to the first-stage integrator module, and configured to perform weighted addition on the second signal and an input analog signal to generate a third signal, the second-stage integrator module is electrically connected to the first weighted adder module, and configured to receive and integrate the third signal to generate a fourth signal, the second weighted adder module is electrically connected to the second-stage integrator module and configured to perform weighted addition on the fourth signal, the second signal and the input analog signal to generate a fifth signal, the limiter is electrically connected to the second weighted adder module and configured to receive and limit the fifth signal to generate a sixth signal, the quantizer is electrically connected to the limiter and configured to quantify the sixth signal to generate an output digital signal, and the feedback module is electrically connected to the quantizer and configured to receive the output digital signal and generate the feedback signal by delaying the output digital signal, the weighted subtractor module is electrically connected to the feedback module and the first-stage integrator module and configured to perform weighted subtraction on the input analog signal and the feedback signal, so as to generate the first signal.

13. The circuit system according to claim 10, wherein the ending time point of the second reset signal is later than the ending time point of the first reset signal by a clock cycle.

14. The circuit system according to claim 13, wherein the reset signal processing module comprises an OR gate and a transfer function unit, the OR gate is electrically connected to the first-stage integrator module and the transfer function unit, the transfer function unit has a transfer function of $(1/z)$ and configured to delay the first reset signal by a clock cycle, and output the delayed first reset signal to the OR gate, wherein the OR gate is configured to perform OR calculation on the first reset signal and the delayed first reset signal to generate the second reset signal.

15. The circuit system according to claim 12, wherein a transfer function of a transfer function unit of the first-stage integrator module is $z/(z-1)$.

16. The circuit system according to claim 15, wherein a transfer function of a transfer function unit of the second integrator module is $z/(z-1)$.

17. The circuit system according to claim 15, wherein a transfer function of a transfer function unit of the second integrator module is $1/(z-1)$.

* * * * *